(12) United States Patent
Agarwal et al.

(10) Patent No.: US 9,582,358 B2
(45) Date of Patent: Feb. 28, 2017

(54) INITIALIZATION SCHEME DURING DUAL PROGRAMMING OF A MEMORY SYSTEM

(71) Applicant: SanDisk Technologies Inc., Plano, TX (US)

(72) Inventors: Dinesh Agarwal, Bangalore (IN); Vijay Sivasankaran, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 42 days.

(21) Appl. No.: 14/700,543

(22) Filed: Apr. 30, 2015

(65) Prior Publication Data

US 2016/0092302 A1 Mar. 31, 2016

(30) Foreign Application Priority Data

Sep. 30, 2014 (IN) .......................... 4928/CHE/2014

(51) Int. Cl.
```
G11C 29/00      (2006.01)
G06F 11/10      (2006.01)
G11C 29/52      (2006.01)
G06F 3/06       (2006.01)
G11C 7/20       (2006.01)
```
(52) U.S. Cl.
CPC .......... *G06F 11/1068* (2013.01); *G06F 3/064* (2013.01); *G06F 3/0619* (2013.01); *G06F 3/0679* (2013.01); *G11C 7/20* (2013.01); *G11C 29/52* (2013.01)

(58) Field of Classification Search
CPC .......... G11C 29/52; G11C 7/20; G06F 3/0619; G06F 3/064; G06F 3/0679
See application file for complete search history.

(56) References Cited

U.S. PATENT DOCUMENTS

| | | | |
|---|---|---|---|
| 2003/0225961 A1* | 12/2003 | Chow | G06F 3/0616 711/103 |
| 2008/0034154 A1* | 2/2008 | Lee | G06F 12/0246 711/103 |
| 2010/0172179 A1* | 7/2010 | Gorobets | G06F 12/0246 365/185.09 |
| 2011/0096601 A1* | 4/2011 | Gavens | G11C 11/5628 365/185.09 |
| 2013/0019076 A1* | 1/2013 | Amidi | G06F 11/1441 711/162 |

\* cited by examiner

*Primary Examiner* — Sam Rizk (74) *Attorney, Agent, or Firm* — Brinks Gilson & Lione (57) ABSTRACT

A memory system or flash memory device may include mechanism for handling power loss with a dual programming architecture. The state of primary and secondary blocks may be reconstructed to a state immediately preceding a power loss. The reconstruction may include comparing error correction code (ECC) headers of blocks to recreate a block exchange with fewer control updates. The comparison can be used to identify a primary and secondary block. The header may identify a particular stream, identify a free block, identify a release block, and other information.

20 Claims, 8 Drawing Sheets

INITIALIZATION SCHEME DURING DUAL PROGRAMMING OF A MEMORY SYSTEM

PRIORITY

This application claims priority to Indian Patent Application No. 4928/CHE/2014, entitled "INITIALIZATION SCHEME DURING DUAL PROGRAMMING OF A MEMORY SYSTEM," filed on Sep. 30, 2014, the entire disclosure of which is hereby incorporated by reference.

TECHNICAL FIELD

This application relates generally to memory devices. More specifically, this application relates to the reconstruction of data in a memory device.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory may be written in pages and erased in blocks, so once a page is written, a rewrite may require the whole block to be erased. Once a host block becomes full, a new block may be exchanged from a pool of free blocks. In the case of a power cycle or a power loss the latest block exchange may be lost.

SUMMARY

A memory system or flash memory device may include a process for exchanging free blocks from a free block list during a dual write/programming process. During a block exchange, the free blocks and host blocks may be referred by control data structures that need to be updated to reconstruct the new block allocation. The proposed reconstruction scheme minimizes the number of control updates during block exchanges from the free block list in order to reconstruct the block exchanges can be reconstructed following a power cycle/loss. The reconstruction may include comparing error correction code (ECC) headers to recreate a block exchange with fewer control updates.

The dual write/programming may include linking or grouping of blocks that are used for maintaining a duplicate copy of data in different blocks. A primary and secondary meta-block may be update blocks for host data. The dual programming of the blocks with the duplicate/secondary copy may be used for error correction. If there is a failure or write error in the primary meta-block, then the duplicate data from the secondary meta-block may be used. If there is no failure in the programming of the primary meta-block, then the secondary meta-block may be erased.

BRIEF DESCRIPTION OF THE PRESENTLY PREFERRED EMBODIMENTS

Figure 1:
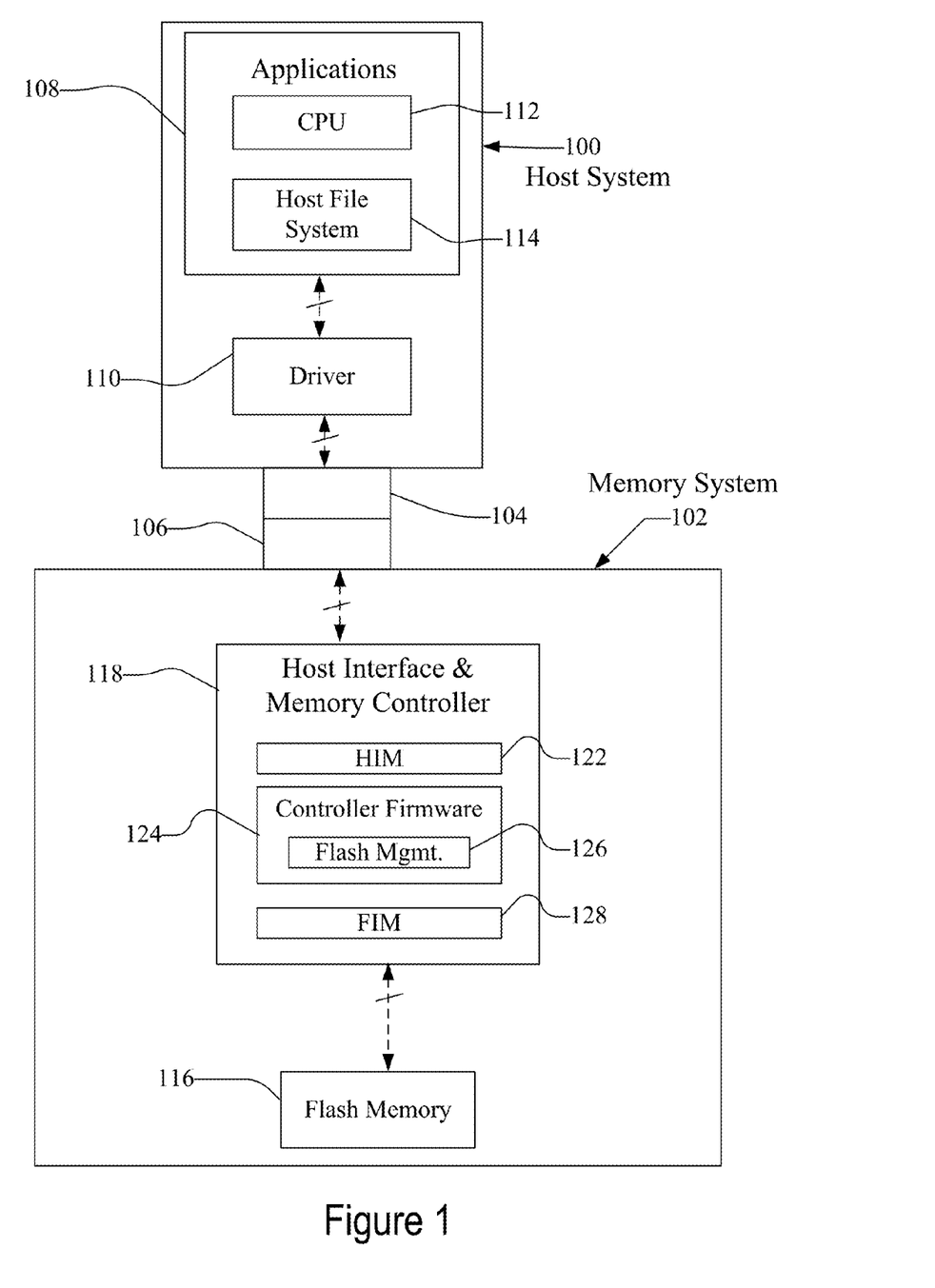
FIG. 1 is a block diagram of a host connected with a memory system having non-volatile memory.

A flash memory system suitable for use in implementing aspects of the invention is shown in FIGS. 1-4. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may be implemented on a single integrated circuit chip, such as an application specific integrated circuit (ASIC). The device controller 118 may include a multi-thread processor capable of communicating via a memory interface 128 having I/O ports for each memory bank in the flash memory 116. The device controller 118 may include an internal clock. The processor of the device controller 118 may communicate with an error correction code (ECC) module, a RAM buffer, and a boot code ROM via an internal data bus.

The memory system RAM may include a master index page (MIP) that is a control structure that holds the most up-to-date information about the MML module data structures and references to the modules. Upon booting/initialization, a copy of MIP is loaded to RAM. This provides quicker access to MIP and to modules MIP utilizes. The RAM copy of MIP is the most up-to-date copy and when certain conditions are met, the RAM copy is flushed to the flash. However, the RAM copy may not always be in sync with the flash copy and only at certain times will the RAM copy be flushed to flash. If there is a power cycle or abrupt power loss, then the MIP copy stored on flash may not contain the latest data. Accordingly, the initialization process described below can be used to update the MIP copy by replaying the events and reconstructing the RAM copy of MIP.

MIP can be used to recreate a state of the device prior to an inadvertent power cycle or power loss. For example, the MIP (stored in flash) may include a version of the update blocks (i.e. the primary block and secondary block) for a particular stream. This version in flash may not match the version stored in RAM, and may be referred to as an initial state that is used to recreate the state (i.e. final state) before the power cycle/loss. As described below, this initial state information may be used to recreate the state just before a power cycle/loss because the block exchange that occurs after the initial state and before the power cycle/loss may not be recorded in the MIP in the flash. In addition, MIP includes information about the free block list (FBL), the current update blocks being used, global address table (GAT) or inverted global address table (IGAT) deltas and other relevant information used by other modules in MML. MIP is stored in a GAT block on the flash whenever the RAM copy is flushed.

In one embodiment, the MIP may include:
Global Address Table (GAT) and inverted GAT (IGAT) Block List—blocks containing GAT/IGAT and Master Index pages;
GAT directory—pointers to valid GAT pages;
IGAT directory—pointers to valid IGAT pages;
GAT delta—cache of changes to GAT not yet updated in GAT pages;
IGAT delta—cache of changes to IGAT not yet updated in IGAT pages;
Binary Free Block List;
MLC Free Block List;
Folding Manager Variables, which gives destination block and some LG sources;
Update Block Info—blocks and LGs in active binary working set;
GC Context Info;
MML Error logs;
Atomic Operations;
Read Scrub block list; and
Wear levelling information.

The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module (FIM) 128. Flash management logic 126 may be part of the controller firmware 124 for internal memory management operations such as garbage collection. One or more flash interface modules (FIMs) 128 may provide a communication interface between the controller and the flash memory 116. The memory device firmware may handle memory in logical groups and the logical to physical address table (i.e. the global address table or "GAT") may have an entry for each logical group. In particular, the GAT page may include mapping of the logical to the physical address translation for each logical group.

A flash transformation layer ("FTL") or media management layer ("MML") may be integrated in the flash management 126 and may handle flash errors and interfacing with the host. In particular, flash management 126 is part of controller firmware 124 and MML may be a module in flash management. The MML may be responsible for the internals of NAND management. In particular, the MML may be an algorithm in the memory device firmware which translates writes from the host 100 into writes to the flash memory 116. The MML may include the logical block address ("LBA") map that translates addresses for the flash memory. An MML algorithm may provide logical to physical address mapping which includes an algorithm to convert logical addresses from the file system to physical addresses of flash memory. The MML may include the establishment or classification of meta-blocks and the dual programming of those meta-blocks.

In one embodiment, the flash memory 116 may be considered to include multi-level cell (MLC) or single level cell (SLC) memory. The memory may be included as part of the device controller 118 rather than as part of the flash memory 116 in some embodiments. The flash memory 116 may be mostly MLC, while binary cache and update blocks may be SLC memory. Update blocks may be SLC memory with page based addressing or page based Logical Group (LG) organization. The LG size for the GAT may depend on the data. For example, sequential data may be indexed with a large LG size, while fragmented data may be indexed with a smaller LG size. In particular, the GAT may default to a large LG size, but reference additional GAT pages for fragmented data, where the additional GAT pages include a smaller LG size. The LG size for the GAT and additional GAT pages may occur at the MML or flash management 126 of the controller 118.

Figure 2:
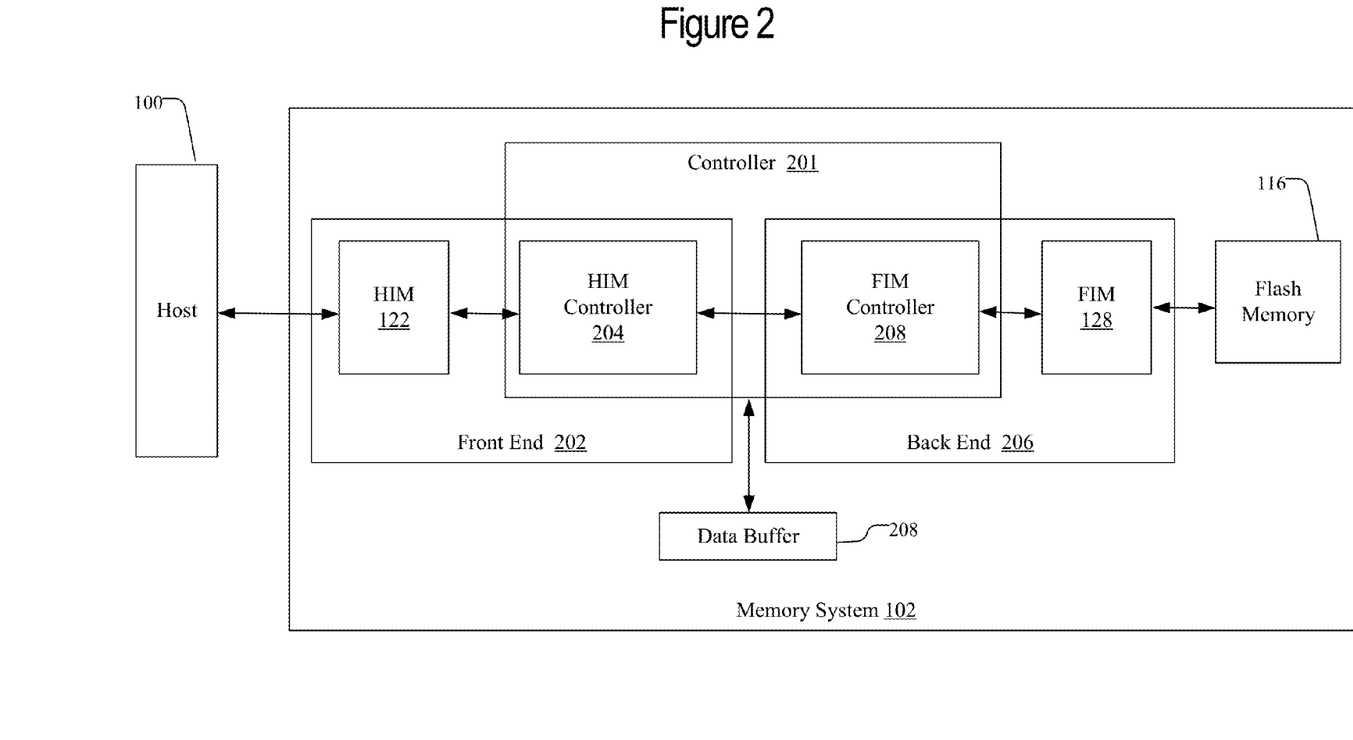
FIG. 2 is a block diagram of an alternative memory communication system.

FIG. 2 is a block diagram of an alternative memory communication system. The host system 100 is in communication with the memory system 102 as discussed with respect to FIG. 1. The memory system 102 includes a front end 202 in communication with the host and a back end 206 coupled with the flash memory 116. In one embodiment, the front end 202 and the back end 206 may be referred to as the memory controller and may be part of the device controller 118. The front end 202 may logically include a Host Interface Module (HIM) 122 and a HIM controller 204. The back end 206 may logically include a Flash Interface Module (FIM) 128 and a FIM controller 208. Accordingly, the controller 201 may be logically portioned into two modules, the HIM controller 204 and the FIM controller 208. The HIM 122 provides interface functionality for the host device 100, and the FIM 128 provides interface functionality for the flash memory 116. The controller 201 may be coupled with a data buffer 208.

In operation, data is received from the HIM 122 by the HIM controller 204 during a write operation of host device 100 on the memory system 102. The HIM controller 204 may pass control of data received to the FIM controller 208, which may include the MML discussed above. The FIM controller 208 may determine how the received data is to be written onto the flash memory 116 optimally. The received data may be provided to the FIM 128 by the FIM controller 208 for writing data onto the flash memory 116 based on the determination made by the FIM controller 208. The FIM controller 208 and the MML may operate the block exchange and dual programming to those meta-blocks as described below with respect to FIGS. 5-9.

Figure 3:
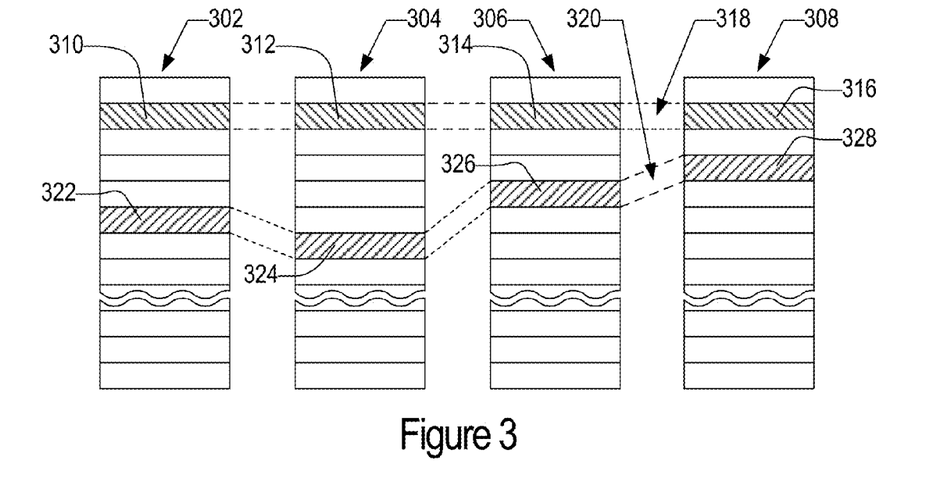
FIG. 3 is an example physical memory organization of the system of FIG. 1.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. Although not shown in FIG. 3, the meta-blocks described below with respect to FIG. 6 may be linked from across different dies. For example, there may be two planes per di and the meta-block linking shown in FIG. 6 links planes from different dies.

Other numbers of planes, such as 1, 2, 8, 16 or more may exist in a system. The planes may be individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane. The block of memory cells is the unit of erase, and the smallest number of memory cells that are physically erasable together. For increased parallelism, however, the blocks may be operated in larger metablock units or chunks. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below with respect to FIG. 6, the meta-block may be created with planes from different dies. In other words, each meta-block includes planes from different dies.

Figure 4:
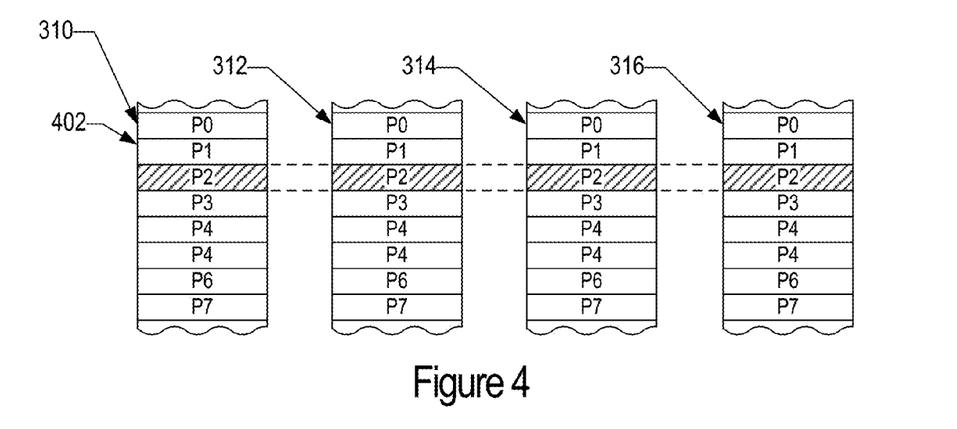
FIG. 4 is an expanded view of a portion of the physical memory of FIG. 3.

The individual blocks may be divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material.

The block exchange described herein may be within a dual write or dual programming scheme. An exemplary dual programming scheme is described with respect to FIGS. 5-7. Dual programming is further described in U.S. patent application Ser. No. 14/291,560, filed on May 30, 2014, entitled "PROTECTION SCHEME WITH DUAL PROGRAMMING OF A MEMORY SYSTEM", the entire disclosure of which is herein incorporated by reference.

Figure 5:
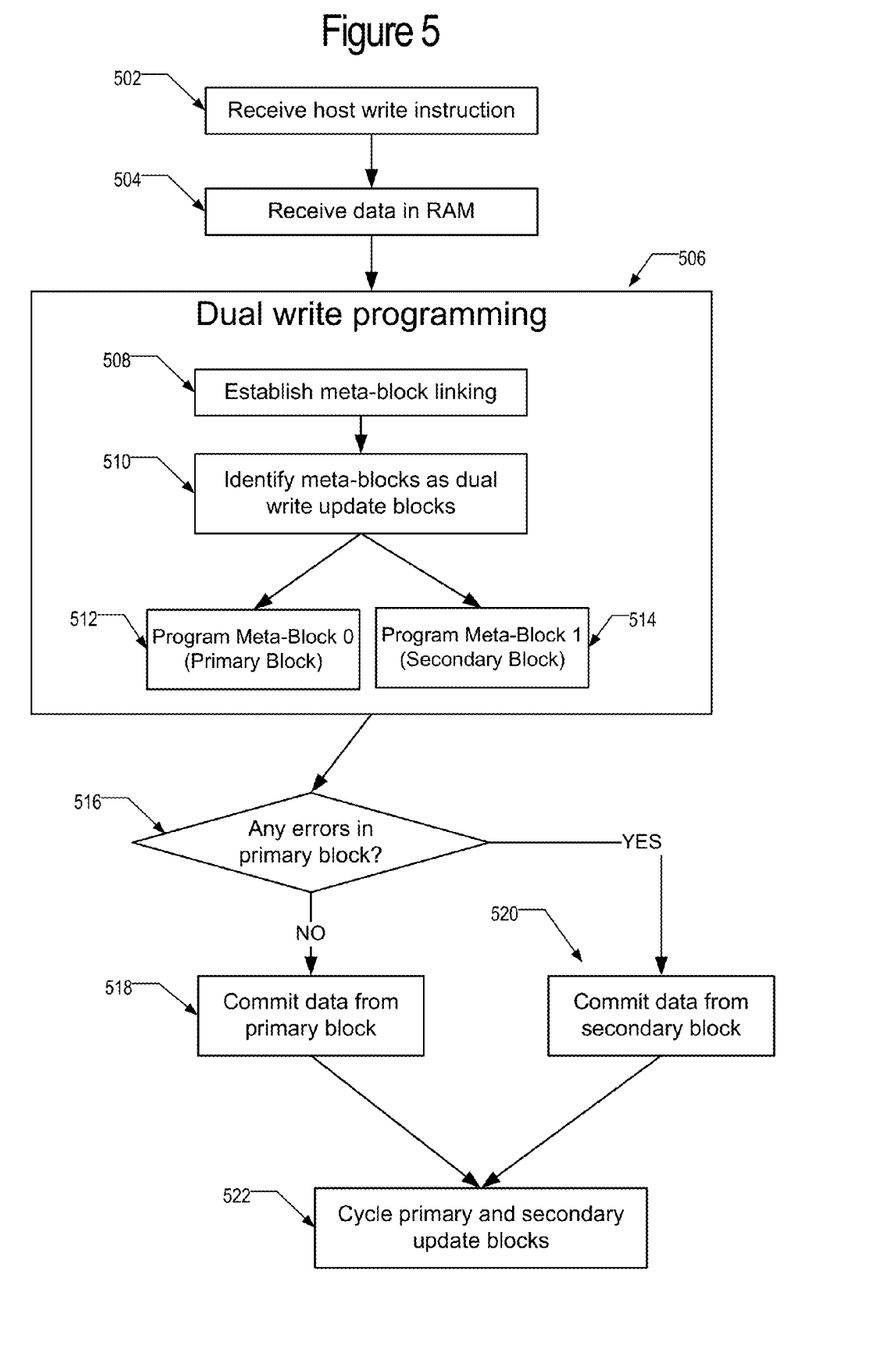
FIG. 5 is flow chart illustrating an exemplary dual programming process.

FIG. 5 is flow chart illustrating an exemplary dual programming process. FIG. 5 illustrates an exemplary process by which data protection may be achieved through the dual writing to multiple meta-blocks. In block 502, a host write instruction is received at the memory system (e.g. at the host interface). Based on the instruction from the host (to program certain data on the memory), the data is received in RAM in block 504. From the RAM, the memory system may utilize the dual programming in block 506. Dual programming may include simultaneous or near simultaneous programming of the same data in different blocks. In the embodiment described below, the data is written to two blocks, but in other embodiments, there may be additional blocks for programming the data for added protection. The dual programming 506 may include an initial establishment of meta-block linking in block 508. The meta-block linking may not occur as part of every host write instruction, but rather may be set upon initialization and further updated (e.g. as in the cycling of blocks as discussed below in block 522). In other words, the establishing of meta-block linking may be optional for each host write if meta-block linking previously occurred. The meta-blocks that are to be used for dual programming update blocks may be identified in block 510. The host data is written to two update blocks, primary and secondary, simultaneously or substantially simultaneously. The identification may include the identification of meta-block 0 (i.e. "primary block") and a meta-block 1 ("secondary block").

Figure 6:
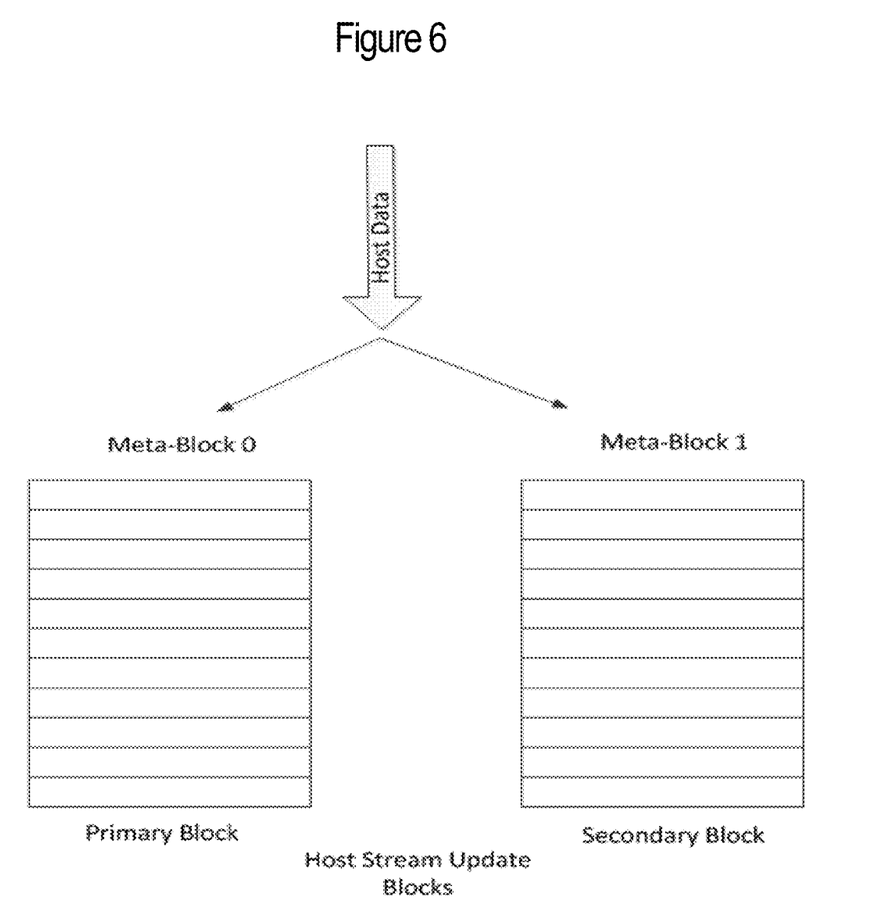
FIG. 6 is a diagram of an exemplary host stream to update blocks.

FIG. 6 is a diagram of an exemplary host stream to update blocks. The primary block is programmed in block 512 and the secondary block is programmed in block 514 as further illustrated in FIG. 6. FIG. 6 illustrates that the host data that is received from the host is programmed to both the primary block and the secondary block. Having the data programmed twice can be a fail-safe for retrieving data when there has been a failure. For example, if there is a failure in the primary block, then the data is not lost because the secondary block may be used to retrieve the data as further discussed below with respect to blocks 516-520 in FIG. 5.

FIG. 6 illustrates a single exemplary stream, but in some embodiments, there may be multiple streams. For example, there may be different files of host data to be written and each file may be written using a different host stream. The utilization of multiple streams may be for optimization and may help prevent or reduce defragmentation by streaming sequential data. As described below, each of the streams may be identified by a stream identifier or stream index so that the blocks of that stream can be identified after a power cycle or power loss.

Referring back to FIG. 5, when the dual programming 506 has occurred and the meta-blocks are programmed, there may be an error checking function that is performed before the data is committed to the memory from the update block. In block 516, errors in the primary block are checked, such as with enhanced post-write-read error management (EPWR). If there are no uncorrectable error codes (UECC) from EPWR in the primary block, then the data is committed from the primary block as in block 518. If there is a UECC in the primary block, then the data may be committed from the secondary block in block 520. After programming a certain number of wordlines (WLs) in the primary block, EPWR may be performed before committing the data in those WLs. If there is a UECC during EPWR or program failure or WL-WL short while programming the primary block, the data in the affected logical pages may be indexed from the secondary block, rather than the primary block.

Figure 7:
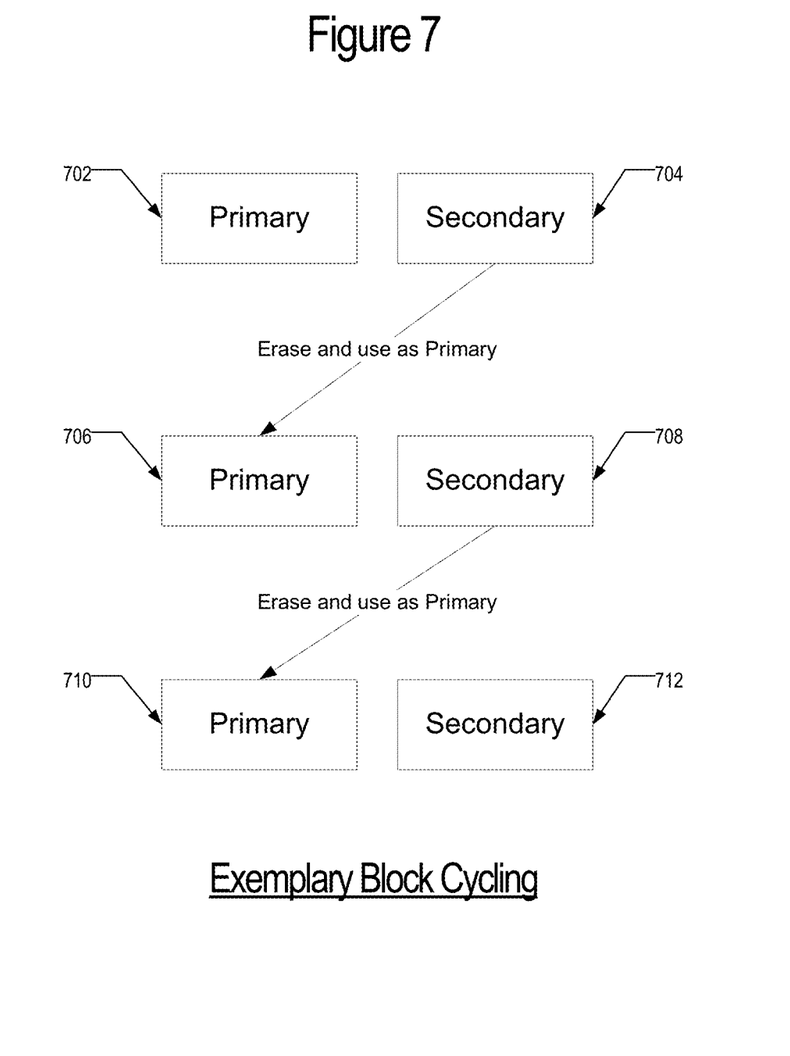
FIG. 7 is a diagram of exemplary update block cycling.

FIG. 7 is a diagram of exemplary update block cycling. The block cycling may also be referred to as block cycling and refers to the exchange/cycling of the primary/secondary blocks during dual programming. Once the data is committed the primary update block and the secondary update block are recycled as shown in FIG. 7. When the primary block 702 and secondary block 704 are used initially and the data is committed from the primary block, then the secondary block 704 may be erased and used as next primary block 706. A new secondary block 708 is used with that next primary block 706. Assuming the data is committed from the next primary block 706, then the new secondary block 708 becomes the next primary block 710 and another new secondary block 712 is chosen. As further described below, the secondary block (e.g. secondary block 708) may be selected from the free block list (FBL) and the original primary block 702 may be a closed block.

During an inadvertent power cycling or power loss, the primary block and the secondary block for each of the streams being programmed may be lost. An efficient mechanism for identifying both the primary block and the secondary block just before the power cycling is described below. This re-creation or replaying of the block exchange prior to power loss may not require the entire process (with all control commands and programming) that took place, but instead may compare error correction code (ECC) page headers for the blocks as a shortcut to identify the primary and secondary blocks, as well as the free block list blocks, prior to power loss.

While writing the host blocks in dual write/programming based architectures, both the primary and secondary block have the same data and the same headers. Accordingly, a comparison of header data can be used as a quicker comparison to identify the primary and secondary blocks. The comparison of headers is a less processor intensive operation than comparing data within a block. Once both blocks become full a new block is taken from the FBL and secondary block is replaced with a new allocated block and the secondary block is allocated as the new primary block as partially illustrated in FIG. 7.

Figure 8:
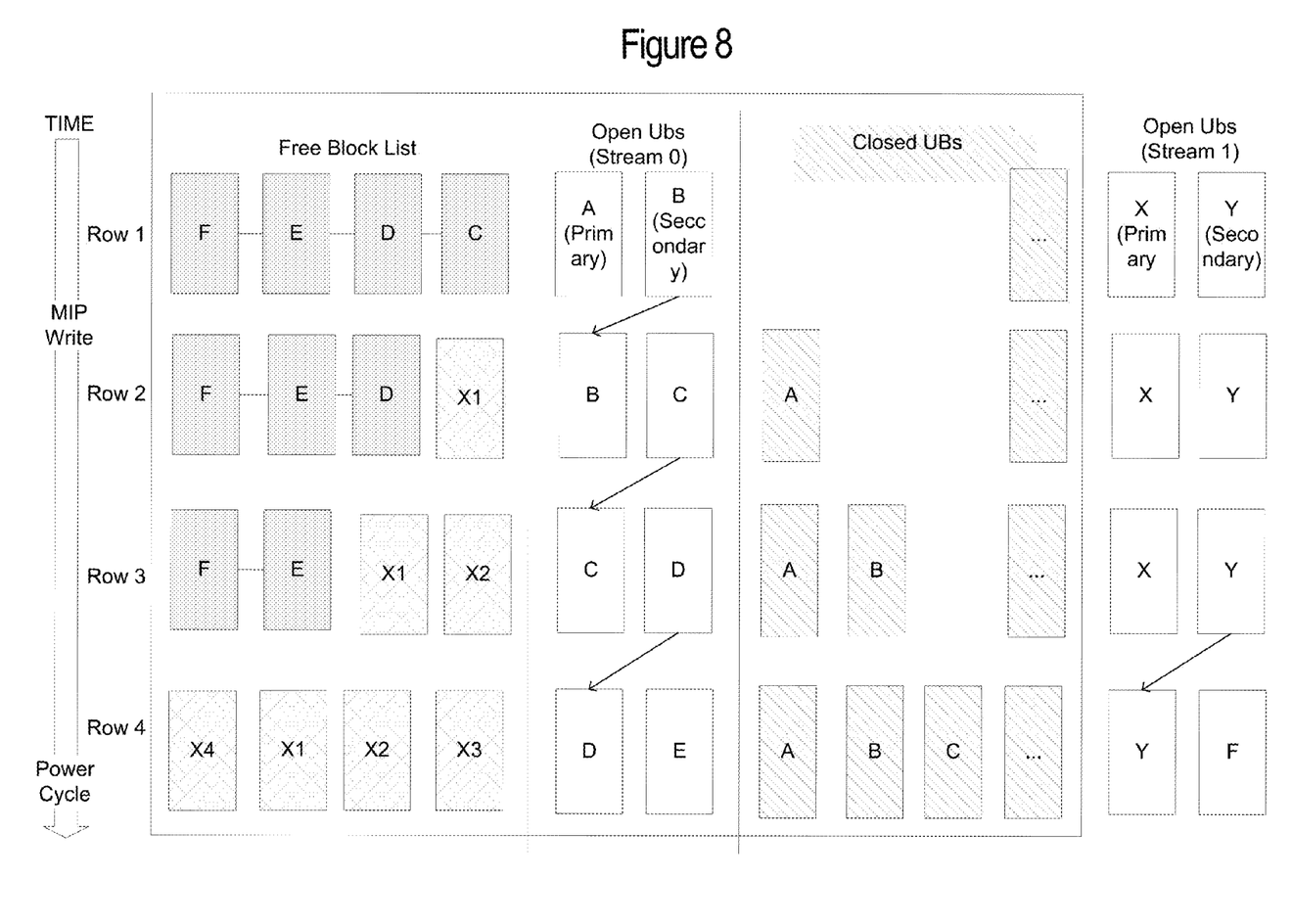
FIG. 8 is a diagram of block exchange or block cycling in two exemplary host streams.

FIG. 8 is a diagram of block exchange or block cycling in two exemplary host streams. Although the embodiments are described as utilizing blocks, the size of the block may vary, and may actually be a meta-block as described with respect to FIGS. 3-4, or may be any other size. FIG. 8 illustrates the cycling, similar to FIG. 7, but FIG. 8 includes multiple streams and further illustrates how the free block list (FBL) is utilized to replace the secondary block, and how other blocks are put into the FBL. As a stream is processed, the primary and secondary blocks are cycled/exchanged as part of the writing/programming process. FIG. 8 illustrates the FBL, the open blocks (upper blocks Ubs) in stream 0 and the blocks in stream 1, along with the closed blocks (upper blocks UBs).

Each of the four rows in FIG. 8 represent a state of the blocks shown before a write or program operation. The following (lower) row represents the changes that are made as a result of the write or programming from the state of the prior row. The changes may be referred to as block cycling or block exchanges. The initial state is the top row and time is on the y-axis such that time progression moves down as shown on the left of the diagram.

The initial state illustrates that for stream 0, the primary block is A and the secondary block is B, and for stream 1, the primary block is X and the secondary block is Y. The FBL in the initial state is C, D, E, F where C is the next free block to be utilized. After a write operation from the initial state (row 1), the next state (row 2) shows that block A is a closed block, the secondary block B is now the primary block for stream 0, and the next free block from FBL becomes the secondary block. The secondary block for stream 0 is block C. Because C was removed from FBL, it is replaced with free block X1. In the example shown in FIG. 8, there is no change to stream 1 after the first row (no write operation for stream 1). The write operation for stream 0 after the second row results in the former primary block B becomes a closed block. The secondary block C becomes primary block C, and the next free block from the FBL becomes the secondary block. Secondary block D is replaced in the FBL by free block X2. In this third row, there is still no write operation from stream 1. After the third row, there is a write operation for both stream 0 and stream 1. Accordingly, the former primary block C is replaced with the former secondary block D and is moved to be a closed block. The secondary block becomes the next free block from the FBL (block E). A similar operation occurs for stream 1 in which the former primary block X is closed, the former secondary block Y becomes the primary block, and the secondary block is the next free block from the FBL (block F). Blocks E and F (the new secondary blocks of stream 0 and stream 1, respectively) are replaced in the FBL by blocks X3 and X4.

After the fourth row, there is a power cycle or power loss. Accordingly, the device or memory system needs to recreate or reconstruct the last state prior to the power cycle/loss, which is the state of the fourth row. The primary and secondary blocks of the streams, the state of the FBL, or the closed blocks may be unknown following the power cycle/loss.

However, after power cycle/loss the control data (MIP) still knows the initial state (row 1). In other words, even after the power cycle/loss, the device knows that blocks A & B are the primary/secondary blocks in Stream 0 and X & Y are the primary/secondary blocks in Stream 1. The state prior to power off can utilize this initial state information to recreate or reconstruct the state prior to the power cycle/loss. However, repeating all the steps may be a processor intensive process that may also take unnecessarily long to recreate and may require excessive MIP writes. Accordingly, certain information can be utilized in an error correction code (ECC) page header as a shortcut to recreating the block exchanges leading to the state prior to the power cycle/loss. This may reduce the control blocks write amplification as control writes are minimized during block exchanges. The sequential write performance may be improved by avoiding the control updates in the middle of a sequential write. Finally, there may be an overall improvement of endurance of a memory device by minimizing the control updates, which results in less compaction. The control blocks may come as one free common pool.

Figure 9:
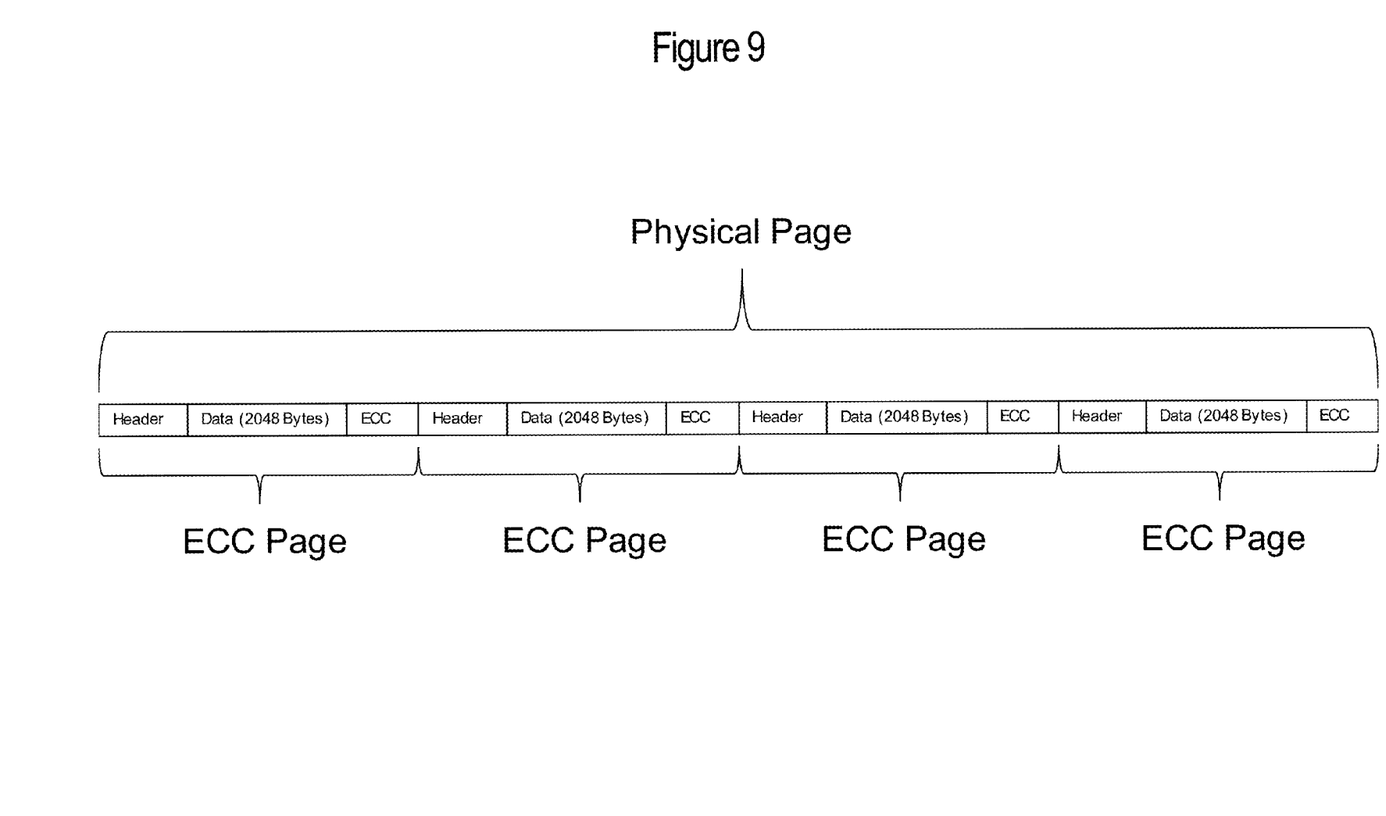
FIG. 9 is a diagram of an error correction code (ECC) page.

FIG. 9 is a diagram of an error correction code (ECC) page. Every block may have multiple physical pages (e.g. 8K or 16K) and every physical page has multiple ECC pages. The ECC data page size may be 2K and there may be an ECC header and ECC bytes for every ECC page. FIG. 9 illustrates an exemplary page layout with an exemplary 8 kilobyte page. Each ECC page includes a header, data (e.g. 2048 bytes), and ECC.

In one embodiment, the ECC header may be a 14 byte header that may include a FBL index, a stream index, a release meta-block, a time stamp, and/or a run length. The FBL index is an identifier that may point to a location (block) in the FBL. In the initial state, the FBL index may point to the next free block (e.g. block C) in the FBL. The stream index refers to a single one of the plurality of streams (e.g. stream 0 or stream 1 in FIG. 8). The release meta-block may be an identifier of the next free block that replaces a free block in the FBL. Since FBL uses a one-in/one-out mechanism, the release meta-block may also be maintained for recreating the FBL. For example, X1 replaces free block C in row 2, so X1 is the release meta-block from the initial state. The next meta-block to be released should be known in order to recreate the final state before power cycle/loss. In other embodiments, the ECC page header may also include a time stamp that provides the time for operations, and a run length (e.g. 4 megabytes) for the stream. Run length (RL) points to contiguous chunks belonging to a particular LG that are present in that block. RL may be indicated in terms of 4K, so 4K data will result in a RL of 1 and 4 MB (exemplary max RL for a LG) will point to RL of 1024. In the header, the start offset and current offsets are stored using which run length is calculated. For example, if for an LG, data is written from 16K to 32K—the start offset is 4 and the offset for the last chunk is 7 so the RL is 7−4+1=4 (that is 16K).

Some of the fields in the header such as the FBL index and the release MB may remain same throughout the pages in the block. Other fields in header such as the logical group (LG) number, offset, and run length may change from one header to another header depending on the data that is written. The primary and secondary update blocks include the same 14 bytes header at any given position so any header can be picked for comparison.

The ECC page headers can be compared to identify whether a particular block is the primary/secondary of a particular stream. The whole block data may also be compared but by comparing only the header (e.g. 14 bytes) the process is significantly quicker. Generally the header from one block to another block will differ (except for primary and secondary headers) so the header is sufficient for comparison. In one embodiment, there may be a randomizer that is introduced in the header to reduce the chance of having the data across two different blocks be the same. If the header data (including the randomizer) matches, then it is reasonably certain that those blocks are the primary and secondary update blocks.

A block may have multiple headers, so generally the first header of the blocks is compared. If there is a problem loading the first header, then the next header is compared. The same relative position in the block is used for both the primary and secondary header. In other words, the second header in the primary block should be compared with second header in the secondary block, or the Nth header in primary is compared with the Nth header in the secondary.

For example, after a power cycle/loss, the blocks being shown as primary and secondary are compared to see if they are in fact the current primary and secondary. If they have the same header, then they are the primary and secondary from before the power cycle/loss. If they are different, then the block exchange can be recreated/replayed using the information from the ECC page header. Headers are compared to detect the block exchange and once the block exchange is detected, the other fields (e.g. FBL index and stream index) may be used to find a block from FBL, and the release meta-block may be used to release the block to FBL. Thereafter the other fields may be used to commit the data in order (using time stamp) and LG info, offset and run length, may also come from the header.

In the initial state (the version stored in the flash MIP), after comparing the data from block A and B, the data is found different and one block exchange is performed from FBL using information from the header from block B. This block exchange/cycling is continued for all the update blocks until the data found in primary and secondary blocks are the same, which indicates that the final state of update blocks (before the power cycle/loss) is reached. In the example shown in FIG. 8, the block exchange that is recreated would lead to a comparison of blocks D and E, which are the same, so the comparison would indicate that they are the primary and secondary blocks, respectively. That block exchange that is recreated using the ECC page headers would result in the state as shown in row 4. This final state can them be copied to and stored in the MIP.

In an alternative embodiment, rather than a power loss/cycle, there may be a write/erase abort that occurs. Such an abort may result in uncorrectable error correction code (UECC) or erased data which would stop the block exchange at the point in which the abort occurred. In particular, the ECC page header may include an indication of the UECC that is identified in the comparison. Accordingly, this dual programming initialization method also includes this process for handling write/erase aborts. Once the data is read for any ECC page, the data goes through the ECC engine and the ECC bytes computed by ECC engine are compared against the ECC bytes stored in ECC page. If they are beyond ECC correction then it is indicated as UECC. This UECC is detected at run time after reading the data. Once the UECC is detected in the last written page, it is confirmed as a write abort, which indicates that no further data is written and the process is stopped and the block is marked for write abort recovery which is later handled post-initialization.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A method comprising:
   establishing, for a memory system, a primary update meta-block and a secondary update meta-block for dual programming in one or more streams;
   cycling the primary update meta-block and the secondary update meta-block by utilizing a free block list;
   storing a stream index and a free block list index in an error correction code (ECC) page header of pages of both the primary update meta-block and the secondary update meta-block; and
   determining, upon a power cycle in the memory system, the primary update meta-block and the secondary update meta-block for the one or more streams utilizing a comparison of the ECC page header.

2. The method of claim 1 wherein the cycling comprising:
   converting the secondary update meta-block into the primary update meta-block; and
   converting a block from the free block list into the secondary update meta-block.

3. The method of claim 1 wherein each of the streams includes its own primary update meta-block and a secondary update meta-block.

4. The method of claim 1 wherein the stream index comprises an identification of one stream from the one or more streams and the free block list index comprises an identification of a block from the free block list that is cycled.

5. The method of claim 1 wherein the primary update meta-block is from a first di and the secondary update block is from a second di.

6. The method of claim 4 wherein the block that is cycled becomes the secondary update meta-block.

7. The method of claim 1 wherein the dual programming comprises:
   programming, from a host write command, data to both the primary update meta-block and the secondary update meta-block;
   checking for errors from the programming of the primary update meta-block;
   committing the host write command from the primary update meta-block when there are no errors or failures with the primary update meta-block; and
   committing the host write command from the secondary update meta-block when there are errors or failures with the primary update meta-block.

8. The method of claim 7 wherein cycling comprises:
   closing the primary update meta-block;
   selecting a free block from the free block list as the secondary update meta-block; and
   utilizing the secondary update meta-block as the primary update meta-block for a subsequent host write command.

9. The method of claim 7 wherein the checking for errors comprises enhanced post-write-read error management (EPWR).

10. The method of claim 7 wherein the errors or failures comprises one or more uncorrectable error codes (UECC).

11. The method of claim 1 wherein the recreating further comprises:
    identifying a stream to recreate for the primary update meta-block and the secondary update meta-block with the stream index;

identifying a next free block that is to be cycled before the power cycle with the free block list index;
cycling through the identified stream; and
comparing the ECC page headers for each block that is cycled until the ECC page headers match.

12. The method of claim 1 wherein the ECC header further comprises a release meta-block, wherein the release meta-block is a next block added to the free block list.

13. A method in a dual programming memory system comprising:
replaying a block exchange to identify a primary block and a secondary block immediately before a power cycle by starting with an initial primary block and an initial secondary block; and
comparing an error correction code (ECC) page header for each of the blocks during the replaying, wherein the primary block and the secondary block are identified when the ECC page headers match.

14. The method of claim 13 wherein the block exchange comprises:
converting the secondary block into the primary block;
converting a block from a free block list into the secondary block.

15. The method of claim 14 wherein the ECC page header includes a stream index and a free block list index, wherein the stream index comprises an identification of one stream from a plurality of streams programmed, and further wherein the free block list index comprises an identification of a block from the free block list that is part of the block exchange.

16. The method of claim 15 wherein the ECC page header further comprises a release meta-block, wherein the release meta-block is a next block added to the free block list.

17. A memory initialization method in a dual programming scheme comprising:
utilizing, for the dual programming scheme, a primary update block and a secondary update block in one or more streams;
cycling the primary update block and the secondary update block by utilizing a free block list to use a free block from the free block list as the secondary update block;
storing initialization information in an error correction code (ECC) page header of the free blocks from the free block list; and
initializing, upon a power loss, the primary update block and the secondary update block using the initialization information by comparing ECC page headers of the primary update block and the secondary update block as blocks are cycled.

18. The method of claim 17 wherein the initialization information comprises a stream index, a free block list index, and a release meta-block, wherein the stream index comprises an identification of one stream from a plurality of streams programmed, further wherein the free block list index comprises an identification of a block from the free block list that is cycled to the secondary update block, and further wherein the release meta-block is a next block added to the free block list.

19. The method of claim 18 wherein the initializing comprises:
identifying a stream to cycle for the primary update block and the secondary update block with the stream index;
identifying a next free block that is to be cycled before the power loss with the free block list index;
cycling through the identified stream; and
comparing the ECC page headers for each block that is cycled until the ECC page headers match.

20. The method of claim 17 wherein the dual programming scheme comprises:
programming, from a host write command, data to both the primary update block and the secondary update block;
checking for errors from the programming of the primary update block;
committing the host write command from the primary update block when there are no errors or failures with the primary update block; and
committing the host write command from the secondary update block when there are errors or failures with the primary update block.

* * * * *